United States Patent
Ni et al.

(10) Patent No.: US 9,630,833 B2
(45) Date of Patent: Apr. 25, 2017

(54) METHOD TO IMPROVE CANTILEVER PROCESS PERFORMANCE

(71) Applicant: SEMICONDUCTOR MANUFACTURING INTERNATIONAL (SHANGHAI) CORPORATION, Shanghai (CN)

(72) Inventors: Liang Ni, Shanghai (CN); Xinxue Wang, Shanghai (CN)

(73) Assignee: Semiconductore Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/864,851

(22) Filed: Sep. 24, 2015

(65) Prior Publication Data

US 2016/0090292 A1    Mar. 31, 2016

(30) Foreign Application Priority Data

Sep. 26, 2014  (CN) .......................... 2014 1 0505263

(51) Int. Cl.
*H01L 21/00* (2006.01)
*B81C 1/00* (2006.01)

(52) U.S. Cl.
CPC ................... *B81C 1/0015* (2013.01)

(58) Field of Classification Search
CPC ............... B81B 3/0083; B81C 1/0015; B81C 2201/0104
See application file for complete search history.

(56) References Cited

U.S. PATENT DOCUMENTS

| 2015/0353350 A1* | 12/2015 | Berthelot | B81C 1/00349 438/50 |
| 2016/0060097 A1* | 3/2016 | Zhang | B81C 1/00182 257/618 |

* cited by examiner

*Primary Examiner* — Laura Menz
(74) *Attorney, Agent, or Firm* — Kilpatrick Townsend and Stockton LLP

(57) ABSTRACT

A method of manufacturing a cantilever structure includes providing a semiconductor substrate, forming a recess in the semiconductor substrate, forming a sacrificial layer in the recess, forming a cantilever structure layer on the semiconductor substrate and the sacrificial layer, performing an etching process to remove a portion of the cantilever structure layer until a surface of the sacrificial layer is exposed to form a cantilever structure and an opening, and removing a portion of the sacrificial layer to form a void below the cantilever structure so that the cantilever structure is suspended in the void. The cantilever structure thus formed has good morphological properties to ensure that the cantilever structure is free of residues at the bottom and has excellent suspension even if the width of the cantilever structure is relatively large.

11 Claims, 7 Drawing Sheets

METHOD TO IMPROVE CANTILEVER PROCESS PERFORMANCE

CROSS-REFERENCES TO RELATED APPLICATIONS

This application claims priority to Chinese patent application No. 201410505263.8, filed Sep. 26, 2014, the content of which is incorporated herein by reference in its entirety.

BACKGROUND OF THE INVENTION

The present invention relates to semiconductor technology, and more particularly to a semiconductor device and manufacturing method thereof.

Integrated optical waveguide sensors have been developed based on integrated optics technology. Integrated optical waveguide sensors not only have the benefits of fiber optic sensors, but also offer the advantages of multi-functional integration capability, smaller size, lighter weight, higher reliability, lower power consumption over conventional sensors. Integrated optical waveguide sensors are an important part of the new generation of miniaturized, integrated and smart sensor systems.

When sensors become more sophisticated and more demanding in the degree of integration, the benefits of integrated optical waveguide sensors become increasingly more evident and the application areas become more extensive. Integrated optical waveguide sensors are currently used in sensing pressure, electromagnetic field, gas or liquid flow, acceleration, angular velocity, etc. Silicon dioxide as a material for sensing components of an optical waveguide cantilever beam has been extensively studied.

At present, isotropic dry etching is used to form an oxide cantilever beam. When the predetermined width of the oxide cantilever beam is significantly larger than the opening width of the semiconductor substrate, silicon residues are generally present below the oxide cantilever beam and prevent the suspension of the cantilever beam. In order to prevent transmission loss of light or optical signals, an organic polymer is filled below and above the cantilever beam, however, the form (morphology) of the cantilever beam after the isotropic dry etching generally hinders the filling of the organic polymer.

FIGS. 1A through 1E are simplified cross-sectional views illustrating stages of process steps of forming a semiconductor device according to the prior art.

Referring to FIG. 1A, a semiconductor substrate 100 is provided, a thermal oxide layer 101 and a HDP silicon oxide layer 102 are successively formed on semiconductor substrate 100. A patterned photoresist layer 103 is formed on HDP silicon oxide layer 102.

Referring to FIG. 1B, thermal oxide layer 101 and HDP silicon oxide layer 102 are etched using patterned photoresist layer 103 as a mask until a surface of semiconductor substrate 100 is exposed to form an opening 104.

Referring to FIG. 1C, semiconductor substrate 100 is isotropically etched to form a cantilever beam 105. When the predetermined width We of cantilever beam 105 is larger than the width Wo of opening 104, silicon residues 110 are generally present below cantilever beam 105 and in the worst case, make impossible the suspension of cantilever beam 105. An increase in the isotropic dry etching process time cannot solve this problem.

Referring to FIG. 1D, an organic polymer 106 is filled over semiconductor substrate 100 and cantilever beam 105, the poor morphology of cantilever beam 105 (due to the residue 110) may hinder the filling of organic polymer 106 in the space below cantilever beam 105. Thereafter, a patterned photoresist layer 107 is formed on organic polymer 106.

Referring to FIG. 1E, organic polymer 106 is etched using patterned photoresist layer 107 as a mask. The etching stops when a surface of HDP silicon oxide layer 102 is exposed.

As described above, the presence of silicon residues underneath the cantilever beam may hinder the filling of an organic polymer and make the suspension of the cantilever beam impossible, and an increase in isotropic dry etching time may not solve this problem. For these and other reasons there is a need for the present invention.

BRIEF SUMMARY OF THE INVENTION

The summary of present invention is intended to provide basic concepts in a simplified form. Certain embodiments of the present invention provide a method for manufacturing a semiconductor device. The method includes providing a semiconductor substrate, forming a recess in the semiconductor substrate, forming a sacrificial layer in the recess, forming a cantilever structure layer on the semiconductor substrate and the sacrificial layer, performing an etching process to remove a portion of the cantilever structure layer until a surface of the sacrificial layer is exposed to form a cantilever structure and an opening, and removing a portion of the sacrificial layer to form a void below the cantilever structure.

In one embodiment, forming the recess includes forming a photoresist layer having an opening on the semiconductor substrate, performing an isotropic etching process to remove a portion of the semiconductor substrate using the photoresist layer as a mask with a reaction gas of $SF_6$, a pressure of 50 mTorr to 150 mTorr, and a power of 500 W to 1500 W.

In one embodiment, forming the sacrificial layer in the recess includes depositing the sacrificial layer on the semiconductor substrate and filling the recess at the same time, performing a chemical mechanical polishing process on the semiconductor substrate until a surface of the semiconductor substrate is exposed so that a surface of the sacrificial layer is coplanar the surface of the semiconductor substrate.

In one embodiment, the sacrificial layer comprises germanium. Removing the portion of the sacrificial layer comprises a corrosion solution containing hydrogen peroxide so that cantilever structure is suspended in the void.

In one embodiment, the cantilever structure layer includes a lower thermal silicon oxide layer and an upper HDP silicon oxide layer. The lower thermal silicon oxide layer may be formed by performing a thermal oxidation process in an oxygen or air atmosphere, at a temperature between 900° C. and 1175° C., and for a time duration between 1 and 2 hours.

In one embodiment, the lower thermal silicon oxide layer has a thickness in the range between 500 Angstroms and 1000 Angstroms, and the upper HDP silicon oxide layer has a thickness in the range between 800 Angstroms and 1500 Angstroms. In other words, the upper HDP silicon oxide layer is thicker than the lower thermal silicon oxide layer.

In one embodiment, removing the portion of the sacrificial layer includes forming an organic polymer on the cantilever structure and filling the void, forming a patterned photoresist layer on the organic polymer, etching the organic polymer using the patterned photoresist layer as a mask until a surface of the cantilever structure is exposed.

In one embodiment, the recess has a round bottom and a width larger than a depth.

In one embodiment, the cantilever structure has a width larger than a width of the opening disposed adjacent thereof.

Embodiments of the present invention also provide a semiconductor device manufactured by the method described above.

Embodiments of the present invention also provide an electronic device containing the semiconductor device manufactured by the above-described method.

The following description, together with the accompanying drawings, will provide a better understanding of the nature and advantages of the claimed invention.

DETAILED DESCRIPTION OF THE INVENTION

Figure 1A:
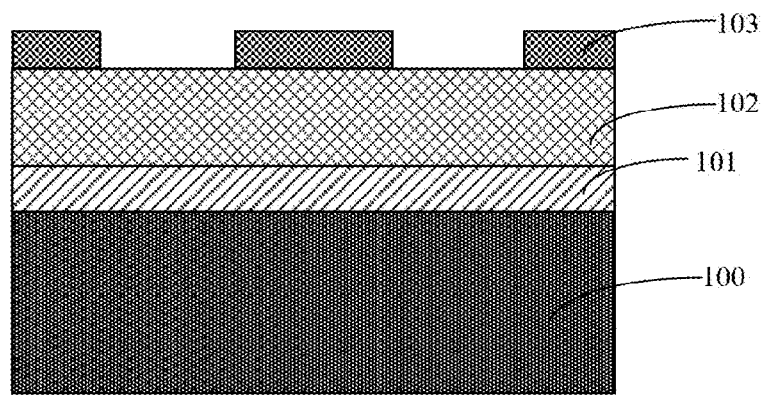
FIGS. 1A-1E are cross-sectional views illustrating intermediate stages of a semiconductor device in a manufacturing method according to the prior art.
Figure 1B:
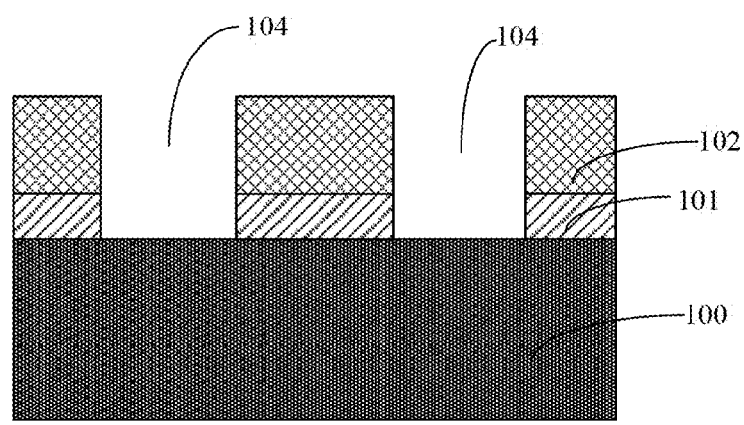
Figure 1C:
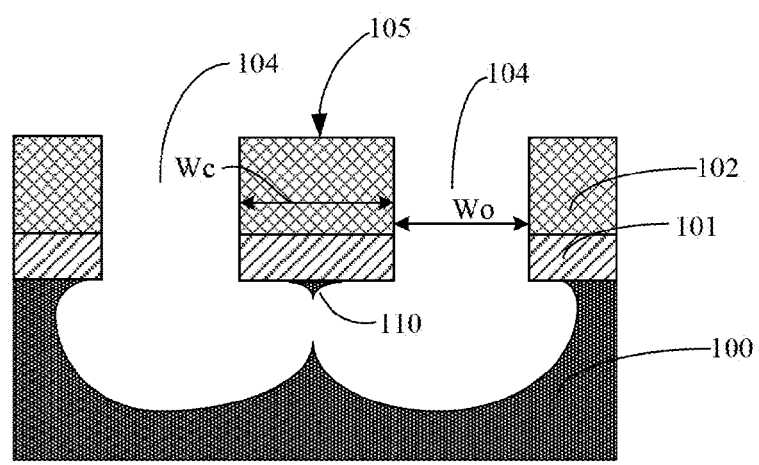
Figure 1D:
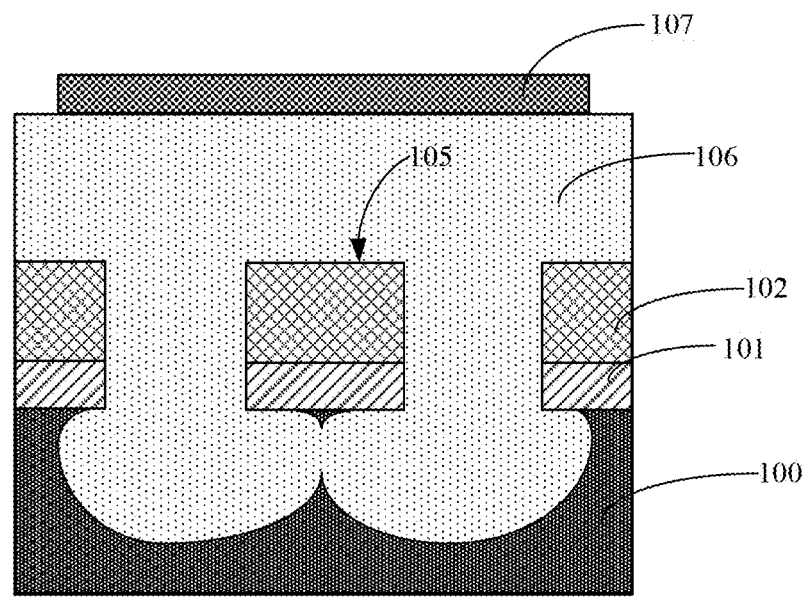
Figure 1E:
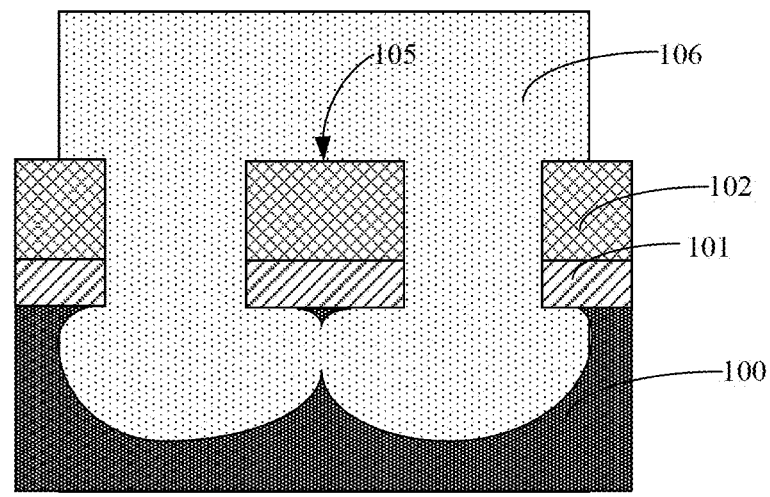

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. ft will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate, The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing, For example, an implanted region illustrated as a rectangle will, typically, have rounded or curved features and/or a gradient of implant concentration at its edges rather than a discrete change from implanted to non-implanted region, Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

FIGS. 2A through 2F are simplified cross-sectional views illustrating stages of process steps of forming a semiconductor device according to an embodiment of the present invention.

Figure 2A:
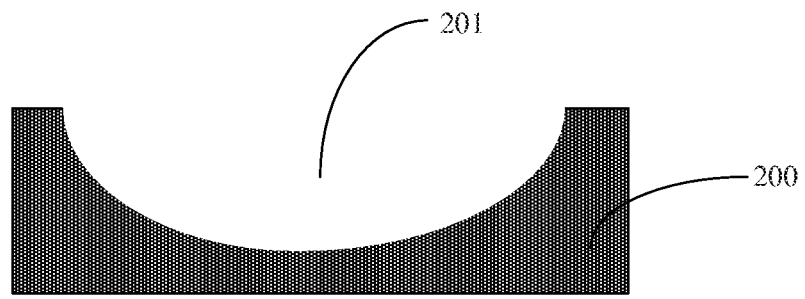
FIGS. 2A-2F are cross-sectional views illustrating intermediate stages of a semiconductor device in a manufacturing method according to an embodiment of the present invention.

Referring to FIG. 2A, a semiconductor substrate 200 is provided. Semiconductor substrate 200 is etched to form a recess 201.

Semiconductor substrate 200 can be silicon, silicon on insulator (SOI), stacked SOI (SSOI), stacked SiGe on insulator (S-SiGeOI), SiGeOI, GeOI, and combinations thereof.

In an embodiment, prior to etching semiconductor substrate 200, a mask layer having an opening may be formed on semiconductor substrate 200. The mask layer can be a photoresist layer. In an exemplary embodiment, the etching can be an isotropic dry etching process. For example, the semiconductor substrate may be etched using sulfur hexafluoride ($SF_6$), xenon difluoride ($XeF_2$) isotropic reactive ion etching process. In an embodiment, the isotropic dry etching can be carried out with a pressure of 50 to 150 mTorr, a power of 500 to 5000 W, and a reaction gas of $SF_6$. The etching rate in the lateral (horizontal) direction is greater than the etching rate in the vertical direction so that the formed recess 201 has a width that is larger than the depth, as shown in FIG. 2A.

Figure 2B:
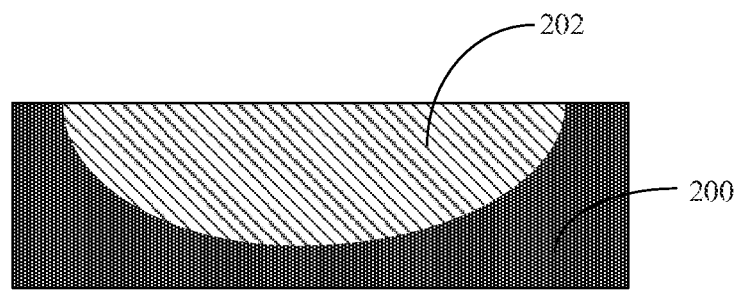

Turning now to FIG. 2B, recess 201 is filled with a sacrificial layer 202. Sacrificial layer 202 may be formed of one or any combinations of amorphous carbon, germanium, silicon, silicon dioxide. Because germanium can tolerate a temperature up to 1175° C., germanium is thus used as the material for the sacrificial layer in the embodiment. Sacrificial layer 202 can be formed using any conventional techniques known to those of skill in the art, such as a physical vapor deposition (PVD), chemical vapor deposition (CVD), atomic layer deposition (ALD), low-pressure chemical vapor deposition (LPCVD), laser ablation deposition (LAD), and selective epitaxial growth (SEG) process. A chemical mechanical process is performed to planarize sacrificial layer 202 so that the surface of the sacrificial layer is coplanar (flush) with the surface of the semiconductor substrate.

Figure 2C:
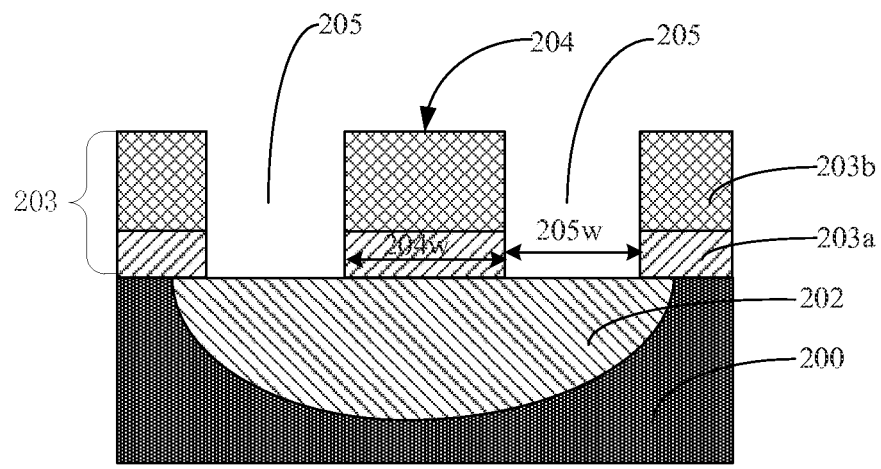

Referring to FIG. 2C, a cantilever structure layer 203 is formed on semiconductor substrate 200 and sacrificial layer 202. Cantilever structure layer 203 is then etched until a surface of sacrificial layer 202 is exposed to form a cantilever structure 204 and an opening 205. In a specific embodiment, the cantilever structure has a width 204w larger than a width 205w of the opening disposed adjacent opposite sides of the cantilever structure.

In an embodiment, cantilever 204 may be silicon oxide, polycrystalline silicon, germanium, and the like. In an embodiment, cantilever structure layer 203 includes a stack of a thermal silicon oxide layer 203a and an HDP silicon oxide layer 203b. Thermal silicon oxide layer 203a and HDP silicon oxide layer 203b form together an optical waveguide layer. Thermal silicon oxide layer 203a can be formed in an oxygen or air atmosphere, at an oxidation temperature in the range between 900° C. and 1175° C., and for a time duration of about 1 to 2 hours. Because germanium can stand a high temperature of 1175° C. so that the sacrificial layer does not change its characteristics. HDP silicon oxide layer 203b is formed using a high density plasma chemical vapor deposition process. In an exemplary embodiment, thermal silicon oxide layer 203a has a thickness in the range between 500 Angstroms and 1000 Angstroms, and HDP silicon oxide layer 203b has a thickness in the range between 800 Angstroms and 1500 Angstroms.

In an embodiment, the cantilever structure can be other optical waveguide materials, such as an organic polymer including polymethyl methcrylate (PMMA).

In an embodiment, a patterned photoresist layer is formed on cantilever structure layer 203, an etching process is performed on cantilever structure layer 203 using the patterned photoresist layer as a mask until a surface of sacrificial layer 202 is exposed to form cantilever structure 204 and opening 205. Opening 205 is used to remove at least a portion of sacrificial layer 202 below the cantilever structure to generate a void (space) between the cantilever structure and the semiconductor substrate so that cantilever structure 204 is suspended in the void. In a specific embodiment, the etching process can be performed using a dry etching, which may include but not limited to, reactive ion etching (RIE), ion beam etching, plasma etching or laser cutting. For example, plasma etching may use an oxygen-based gas. Specifically, a relatively low RF energy is used to generate low pressure and high-density plasma gas for the dry etching process. Plasma gas for the dry etching process can also be a hydrogen bromide gas, carbon tetrafluoride ($CF_4$) gas, or nitrogen trifluoride ($NF_3$) gas. It should be noted that those dry etching processes are examples only and not limiting. One of skill in the art may know that other dry etching processes can also be used.

Figure 2D:
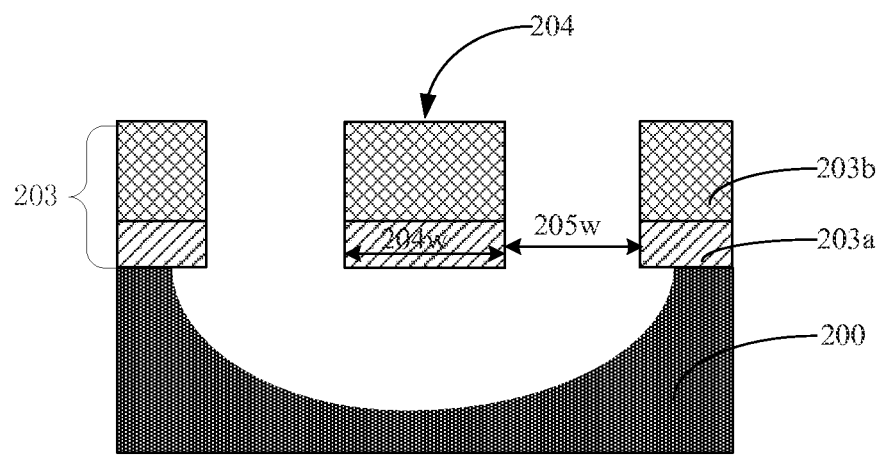

Referring to FIG. 2D, sacrificial layer 202 is removed to release cantilever structure 204.

In an embodiment, the sacrificial layer is made of germanium. A corrosion solution containing hydrogen peroxide ($H_2O_2$) is used to completely remove a portion of the sacrificial layer disposed below cantilever structure 204 to form a void between the bottom of the cantilever structure and the semiconductor substrate so that cantilever structure 204 is suspended in the void. It is to be understood that the described method of removing the sacrificial layer is merely exemplary in nature and not limiting, one of skill in the art will appreciate that other conventional methods may also be used for removing the sacrificial layer.

It is to be understood that FIG. 2D only shows a cross-sectional view of cantilever structure 204 as seen by a viewer looking directly at the figure, the rear-end portion (not shown) of cantilever structure 204 is connected to semiconductor substrate 200.

Figure 2E:
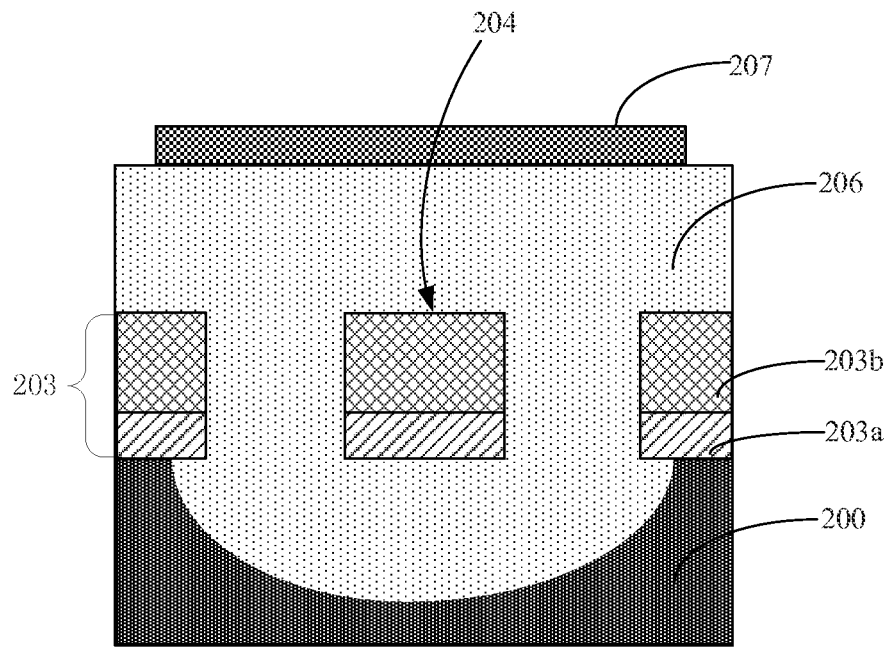

Referring to FIG. 2E, an organic polymer 206 is formed over cantilever structure 204 and fills the void between cantilever structure 204 and semiconductor substrate 200 at the same time. Organic polymer 206 can prevent transmission loss of light or optical signal in cantilever structure 204. In an embodiment, the organic polymer may be formed by a spin coating, dip coating, or ink jet process. It is to be understood that the described method of forming the sacrificial layer is merely exemplary in nature and not limiting, one of skill in the art will appreciate that other conventional methods may also be used.

A patterned photoresist layer 207 is formed on organic polymer 206. In one exemplary embodiment, patterned photoresist layer 207 is formed on organic polymer 206 using a spin coating process, then illuminated using a photolithography mask to form the patterned photoresist layer.

Figure 2F:
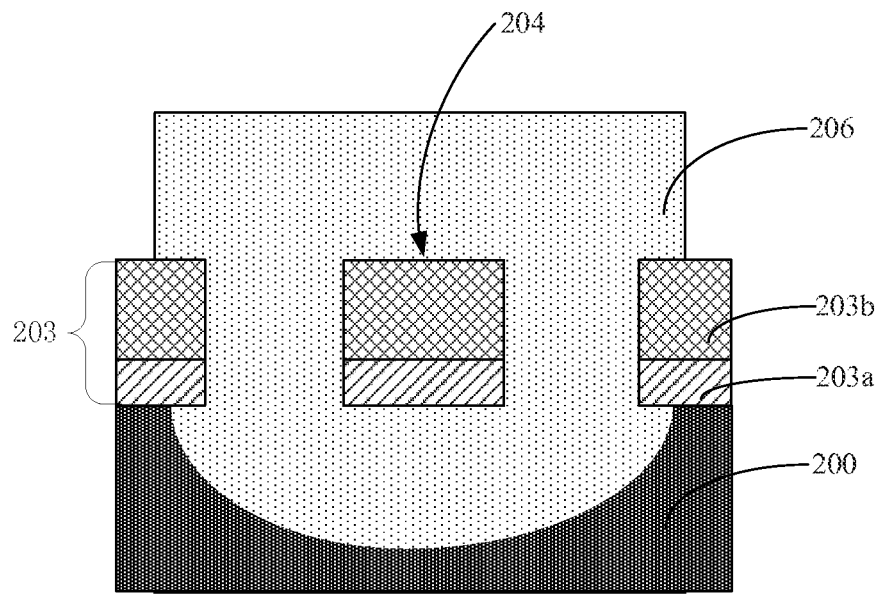

Referring to FIG. 2F, organic polymer 206 is etched using patterned photoresist layer 207 as a mask. The etching process stops when a surface of cantilever structure 203 is exposed.

As seen in FIG. 2F, cantilever structure 203 includes a lower thermal silicon oxide layer 203a and an upper HDP silicon oxide layer 203b so that the etching process stops when the top surface of upper HDP silicon oxide layer 203b is exposed. The etching process can be wet etching or dry etching. In an embodiment, the etching process is performed using a dry etching process, such as reactive ion etching (RIE), ion beam etching, plasma etching or laser cutting. For example, the plasma etching may include an oxygen-based gas. The purpose of etching the organic polymer is to remove excess of the organic polymer and retain only portions of the organic polymer around the cantilever structure.

Thereafter, the patterned photoresist layer is removed. The patterned photoresist layer may be removed by a plasma ashing process.

In accordance with the present invention, a cantilever structure thus formed has good morphology so that no silicon residues are present at the bottom of the cantilever structure to facilitate the filling of an organic polymer in the void between the cantilever structure and the semiconductor substrate. Furthermore, even with a relatively wide width of the cantilever structure, a good suspension of the cantilever structure can be achieved.

Figure 3:
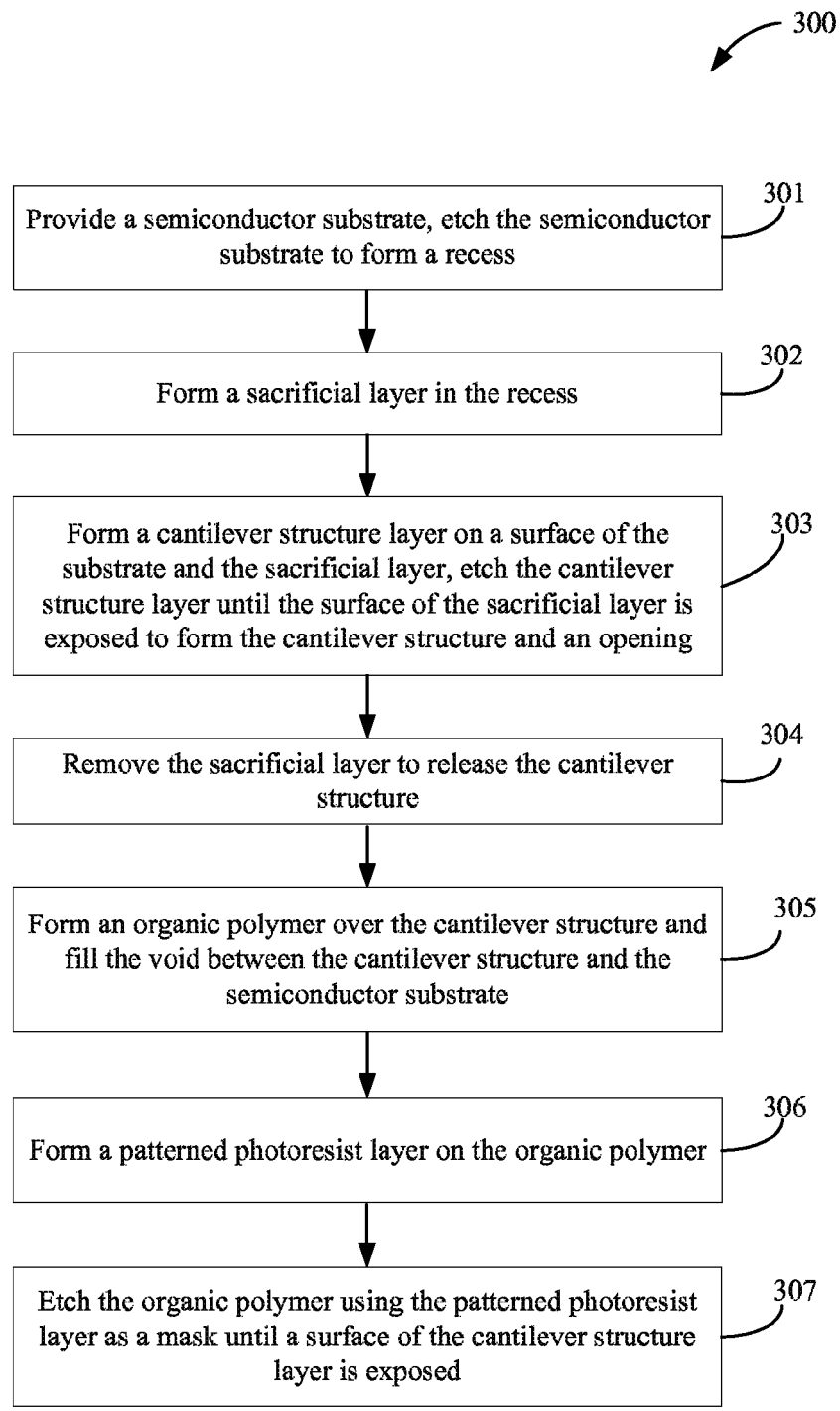
FIG. 3 is a simplified flow chart of a method for manufacturing a semiconductor device according to an embodiment of the present invention.

FIG. 3 is a simplified flow chart of a method 300 for fabricating a semiconductor device according to an embodiment of the present invention. Method 300 includes:

Step 301: providing a semiconductor substrate; performing an etching process on the semiconductor substrate to form a recess;

Step 302: form a sacrificial layer in the recess;

Step 303: form a cantilever structure layer on a surface of the semiconductor substrate and the sacrificial layer; perform an etching process on the cantilever structure layer until the surface of the sacrificial layer is exposed to form a cantilever structure and an opening;

Step 304: remove the sacrificial layer to release the cantilever structure;

Step 305: form an organic polymer over the cantilever structure and fill the void (space) between the cantilever structure and the semiconductor substrate;

Step 306: form a patterned photoresist layer on the organic polymer;

Step 307: perform an etching process on the organic polymer using the patterned photoresist layer as a mask until a surface of the cantilever structure layer is exposed.

Embodiment 2

Figure 4:
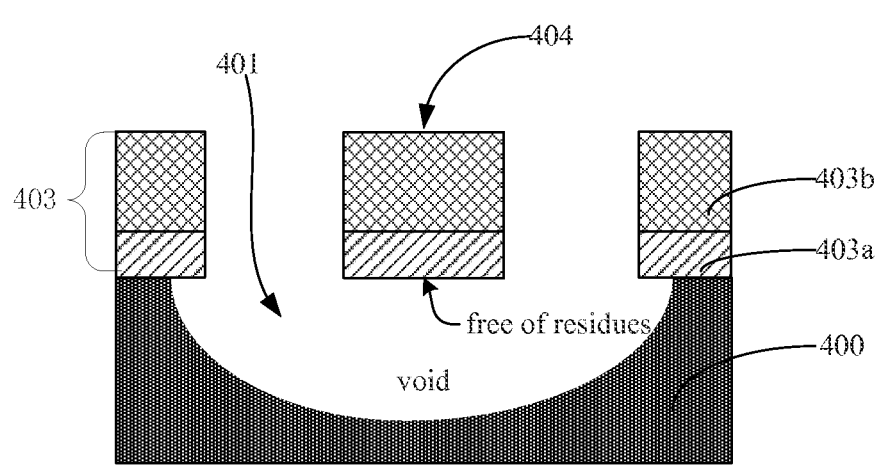
FIG. 4 is a cross-sectional view illustrating an intermediate stage of a cantilever structure according to an embodiment of the present invention.

FIG. 4 is a cross-sectional view illustrating an intermediate structure 40 of a semiconductor device according to an embodiment of the present invention. Intermediate structure 40 of the semiconductor device includes a semiconductor substrate 400, a recess 401 in semiconductor substrate 400 having a round bottom and a width larger than a depth, and a cantilever structure 204 suspending in the void between the bottom of the cantilever structure and the semiconductor substrate. The bottom of the cantilever structure is free of residues to ensure good reliability and performance of the semiconductor device.

Embodiment 3

Embodiments of the present invention provide an electronic device including a semiconductor device that is manufactured by the above-described method of embodiment 1 or the above-described semiconductor device structure of embodiment 2.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve reliability and performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a semiconductor device, comprising:
   providing a semiconductor substrate;
   forming a recess in the semiconductor substrate;
   forming a sacrificial layer comprising germanium in the recess;
   forming a cantilever structure layer on the semiconductor substrate and the sacrificial layer;
   performing an etching process to remove a portion of the cantilever structure layer until a surface of the sacrificial layer is exposed to form a cantilever structure and an opening;
   removing a portion of the sacrificial layer using a corrosion solution containing hydrogen peroxide to form a void below the cantilever structure so that cantilever structure is suspended in the void.

2. The method of claim 1, wherein forming the recess comprises:
   forming a photoresist layer having an opening on the semiconductor substrate;
   performing an isotropic etching process to remove a portion of the semiconductor substrate using the photoresist layer as a mask with a reaction gas of SF6, a pressure of 50 mTorr to 150 mTorr, and a power of 500 W to 1500 W.

3. The method of claim 1, wherein forming the sacrificial layer in the recess comprises:
   depositing the sacrificial layer on the semiconductor substrate and filling the recess;
   performing a chemical mechanical polishing process on the semiconductor substrate until a surface of the semiconductor substrate is exposed so that a surface of the sacrificial layer is coplanar with the surface of the semiconductor substrate.

4. The method of claim 1, wherein the cantilever structure layer comprises a lower thermal silicon oxide layer and an upper HDP silicon oxide layer.

5. The method of claim 4, wherein the lower thermal silicon oxide layer is formed by performing a thermal oxidation process in an oxygen or air atmosphere, at a temperature between 900° C. and 1175° C., and for a time duration between 1 and 2 hours.

6. The method of claim 4, wherein the lower thermal silicon oxide layer has a thickness in a range between 500 Angstroms and 1000 Angstroms, and the upper HDP silicon oxide layer has a thickness in a range between 800 Angstroms and 1500 Angstroms.

7. The method of claim 1, further comprising, after removing the portion of the sacrificial layer:
- forming an organic polymer on the cantilever structure and filling the void;
- forming a patterned photoresist layer on the organic polymer;
- etching the organic polymer using the patterned photoresist layer as a mask until a surface of the cantilever structure is exposed.

8. The method of claim 1, wherein the recess has a width larger than a depth.

9. The method of claim 1, wherein the cantilever structure has a width larger than a width of the opening.

10. A semiconductor device manufactured by the method recited in claim 1.

11. An electronic device comprising the semiconductor device recited in claim 10.

* * * * *